(12) United States Patent
Agarwal et al.

(10) Patent No.: US 8,689,151 B1
(45) Date of Patent: Apr. 1, 2014

(54) PITCH-AWARE MULTI-PATTERNING LITHOGRAPHY

(75) Inventors: Kanak Behari Agarwal, Austin, TX (US); Shayak Banerjee, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/612,790

(22) Filed: Sep. 12, 2012

(51) Int. Cl.
*G06F 17/50* (2006.01)

(52) U.S. Cl.
USPC .................... 716/55; 716/50; 716/54; 716/56

(58) Field of Classification Search
USPC .......................................... 716/50, 54, 55, 56
See application file for complete search history.

(56) References Cited

U.S. PATENT DOCUMENTS

| | | | |
|---|---|---|---|
| 7,251,377 | B2 | 7/2007 | Liu |
| 8,132,130 | B2 | 3/2012 | Chen et al. |
| 8,448,100 | B1* | 5/2013 | Lin et al. .......................... 716/54 |
| 2008/0307381 | A1 | 12/2008 | Tritchkov et al. |
| 2009/0125866 | A1 | 5/2009 | Wang et al. |
| 2009/0128788 | A1* | 5/2009 | Aton ............................... 355/46 |
| 2009/0199137 | A1* | 8/2009 | Huckabay et al. ................ 716/4 |
| 2010/0023914 | A1 | 1/2010 | Sahouria et al. |
| 2011/0004858 | A1 | 1/2011 | Chang et al. |
| 2011/0078638 | A1 | 3/2011 | Kahng et al. |
| 2011/0167397 | A1* | 7/2011 | Huckabay et al. ............. 716/112 |
| 2011/0197168 | A1 | 8/2011 | Chen et al. |
| 2012/0072875 | A1 | 3/2012 | Ghosh et al. |
| 2012/0102442 | A1* | 4/2012 | Ghan et al. ....................... 716/55 |
| 2012/0210279 | A1* | 8/2012 | Hsu et al. ......................... 716/53 |
| 2012/0266110 | A1* | 10/2012 | Cao et al. ......................... 716/52 |
| 2013/0061186 | A1* | 3/2013 | Hsu et al. ......................... 716/55 |
| 2013/0074018 | A1* | 3/2013 | Hsu et al. ......................... 716/55 |
| 2013/0074024 | A1* | 3/2013 | Chase et al. ................... 716/112 |
| 2013/0086543 | A1* | 4/2013 | Agarwal et al. ............... 716/119 |

OTHER PUBLICATIONS

Yuan, K., Yang, J., Pan, D. Z. (Feb. 2010). Double patterning layout decomposition for simultaneous conflict and stitch minimization. IEEE Transactions on Computer-Aided Design of Integrated Circuits and Systems, 29(2), 185-196.

Yang, J., Lu, K., Cho, M. et al. (Jan. 2010). A new graph-theoretic, multi-objective layout decomposition framework for double patterning lithography. 15th Asia and South Pacific Design Automation Conference (ASP-DAC), 637-644.

(Continued)

*Primary Examiner* — Stacy Whitmore
*Assistant Examiner* — Magid Dimyan
(74) *Attorney, Agent, or Firm* — Garg Law Firm, PLLC; Rakesh Garg; John Flynn

(57) ABSTRACT

A method, system, and computer program product for improving printability of a design of an integrated circuit (IC) using pitch-aware coloring for multi-patterning lithography (MPL) are provided in the illustrative embodiments. A first shape is identified in a layout of the IC corresponding to the design as being apart by a first distance from a second shape. The first distance is a forbidden distance and at least equal to a minimum distance requirement of a lithography system. A determination is made that the first shape and the second shape are colored using a first color. The first shape is changed to a second color, such that even though the first distance is at least equal to the minimum distance requirement of the lithography system, the first and the second shapes are placed on different masks to print the design, thereby improving the printability of the design.

20 Claims, 8 Drawing Sheets

CONFLICT GRAPH G = (V,E)

(56) References Cited

OTHER PUBLICATIONS

A.B. Kahng, et al. "Layout decomposition for double patterning lithography", ICCAD 2008.

T.B. Chiou, et al. "Development of layout split algorithms and printability evaluation for double patterning technology", SPIE 2008.

M. Drapeau, et al. "Double patterning design split implementation and validation for the 32nm node", SPIE 2007.

M.L. Ling et al. "Forbidden Pitch improvement using modified illumination" J. Of Vac. Sci. & Tech., 2009.

P. Gupta, "Manufacturing aware design methodology for assist feature correctness", SPIE, 2005.

Thesis: Shi Shichang, ":Lithography friendly routing via forbidden pitch avoidance" Univ of Hong Kong, Jul. 2004.

* cited by examiner

PITCH-AWARE MULTI-PATTERNING LITHOGRAPHY

BACKGROUND

1. Technical Field

The present invention relates generally to a method, system, and computer program product for designing an integrated circuit. More particularly, the present invention relates to a method, system, and computer program product for pitch-aware multi-patterning lithography (MPL).

2. Description of the Related Art

Modern day electronics include components that use integrated circuits. Integrated circuits are electronic circuits formed using Silicon as a substrate and by adding impurities to form solid-state electronic devices, such as transistors, diodes, and resistors. Commonly known as a "chip," an integrated circuit is generally encased in hard plastic. The components in modern day electronics generally appear to be rectangular black plastic pellets with connector pins protruding from the plastic encasement.

Logical synthesis, physical synthesis, and generation of a routed and timing-closed design are some of the functions of an IC design software tool. The software tools used for designing ICs produce, manipulate, or otherwise work with the circuit layout at very small scales. Some of the components that such a tool may manipulate may only measure tens of nanometer across when formed in Silicon. The designs produced and manipulated using these software tools are complex, often including millions of such components interconnected to form an intended electronic circuitry. An interconnected group of components is called a net.

A cell is an actual logic component, such as a semiconductor gate. An IC design software tool can, among other functions, manipulate cells, or interconnect components of one cell with components of other cells, such as to form nets.

Once a design layout (layout) has been finalized for an IC, the design is converted into a set of masks or reticles. A set of masks or reticles is one or more masks or reticles. During manufacturing, a semiconductor wafer is exposed to light or radiation through a mask to form microscopic components of the IC. This process is known as photolithography (lithography).

SUMMARY

The illustrative embodiments provide a method, system, and computer program product for improving printability of a design of an integrated circuit (IC) using pitch-aware coloring for multi-patterning lithography (MPL). An embodiment identifies, in a layout of the IC corresponding to the design, a first shape in a first pair of shapes and a second shape in the first pair of shapes are apart by a first distance, the first distance being at least equal to a minimum distance requirement of a lithography system, the first distance forming a forbidden distance. The embodiment determines that the first shape in the first pair of shapes and the second shape in the first pair of shapes are colored using a first color. The embodiment changes the first shape in the first pair of shapes to a second color, such that even though the first distance is at least equal to the minimum distance requirement of the lithography system, the first shape in the first pair of shapes and the second shape in the first pair of shapes are placed on different masks to print the design, thereby improving the printability of the design.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
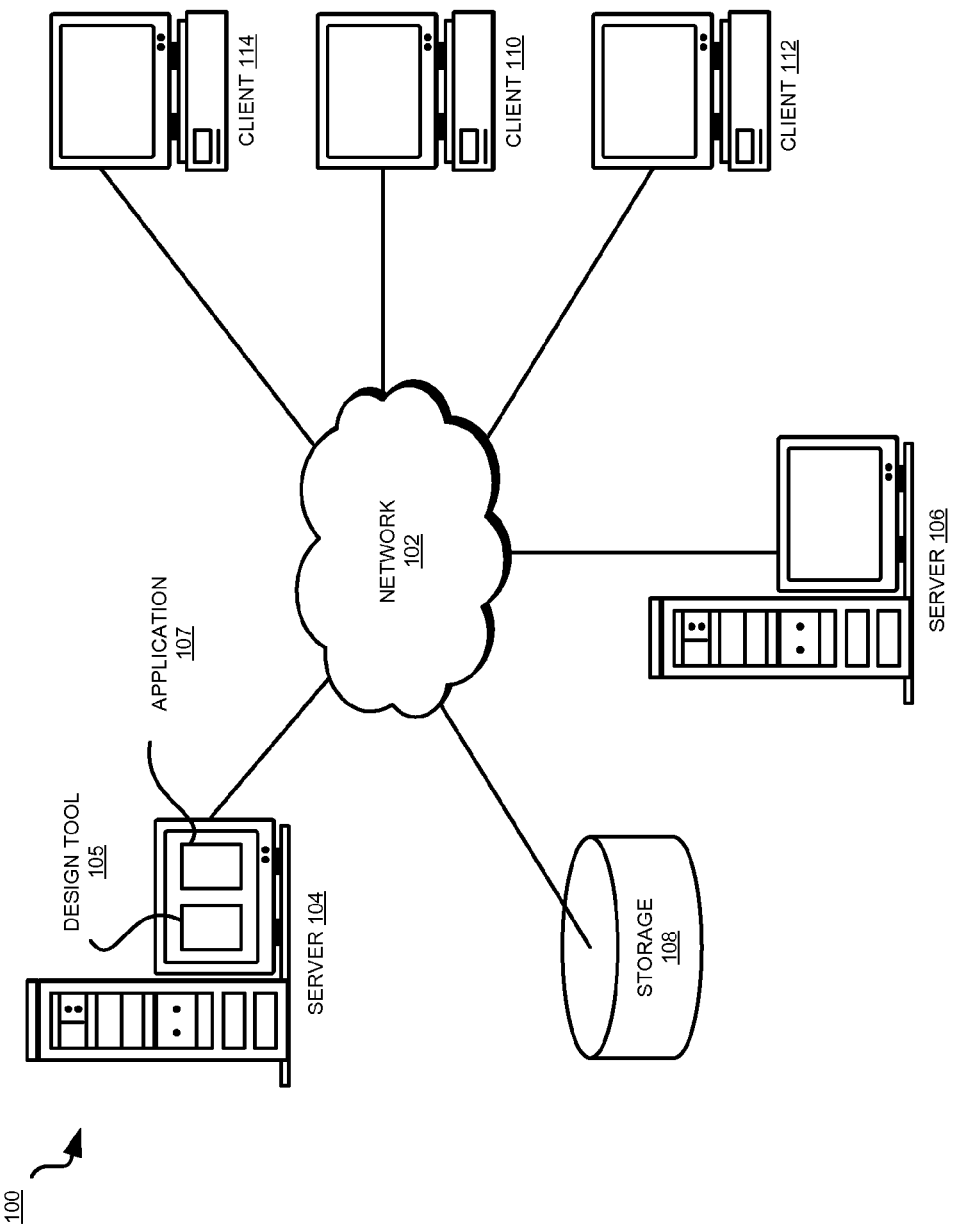
FIG. 1 depicts a pictorial representation of a network of data processing systems in which illustrative embodiments may be implemented.

The IC designs are becoming increasingly complex, the number of components per design is increasing, and the size of components being printed is shrinking. The IC design process is being geared for producing components where the size of the components and inter-component spacing are tens of nanometer (nm) or less across. To give some perspective on the size of the components, the wavelength of the light used for lithography is approximately one hundred and ninety three (193) nm.

Multi-patterning lithography is a method to print sub-resolution features, such as those for the 22 nm and smaller design technology, where a single mask is not sufficient to guarantee the printability of the design. MPL uses multiple separate patterning processes, where each pattering step prints coarser patterns, which are then combined to form the original single finer pattern. Generally in MPL, the target design layout is decomposed into multiple separate targets subject to minimum spacing constraints that can be resolved by the lithography system in a single exposure. MPL layout decomposition is also referred to as "coloring", where different shapes in the original target are colored in different colors, with the total number of available colors determined by the number of exposures in MPL. The set of shapes that receive the same color after decomposition forms a target pattern and represents one exposure of MPL. In so dividing the shapes in the design layout into different colors, the colored masks become more printable, as the shapes of the same color form only a part of the initial target layout and are much farther apart, as compared to when all the shapes are printed simultaneously.

Double patterning lithography (DPL) is a variation of MPL where a layout is colored using two colors. For example, the components or shapes in a layout that may be colored red are printed in one iteration of double patterning lithography, and the components or shapes in the layout that may be colored green are printed in another iteration of double patterning lithography. A shape can be broken up such that a part of the shape is of one color, and another part of the shape is of another color. This process of coloring different parts of shape in different colors is known as "stitching". As an example, a shape colored using two colors in this manner is split into two masks, and the patterns from the two masks are connected together through mask overlapping.

The embodiments are described herein using DPL examples only for the clarity of the disclosure and not as a limitation on the embodiments. A problem recognized by an embodiment in presently available DPL technology is also recognized by the embodiments in the presently available MPL technology. Using this disclosure, an embodiment can be implemented in a DPL implementation as well as in an MPL implementation within the scope of the embodiments.

In a multi-patterned design, a coloring conflict is a problem where shapes or parts thereof in a design cannot be colored in different colors without violating a minimum distance restriction for distance between same colored shapes. The minimum distance restriction arises due to limitations of the lithography technology or system used to fabricate the shapes onto a wafer.

Suppose that a cell has shapes A, B, and C. Shapes A, B, and C are so situated in the cell that the distances between A and B, B and C, and C and A, are each less than a minimum distance restriction. Accordingly, A and B have to be colored differently, B and C have to be colored differently, and C and A, have to be colored differently. In a DPL coloring scheme, this configuration poses a coloring problem, also known as a native conflict, or a coloring conflict. For example, if A is colored red then B has to be colored a different color, for example, green. But if B is green, then C has to be colored red, which then conflicts with A of the same color, resulting in the native conflict.

The illustrative embodiments recognize that presently-available MPL coloring solutions only solve for the minimum spacing constraint according to the limitations of the lithography system used. The illustrative embodiments further recognize that even after an MPL coloring solution achieves shape-separation greater than the minimum spacing constraint, certain shapes remain problematic when printed using the colored masks.

For example, the illustrative embodiments recognize that shape-pairs at certain pitch exhibit poor printability, even if at that pitch, the spacing between shapes is greater than the minimum spacing constraint. The printability of a shape is considered poor if the printed shape does not exhibit acceptable lithographic variation or acceptable electrical properties within the tolerances specified in the design specifications. Such a pitch is referred to as a "forbidden pitch" in this disclosure.

The illustrative embodiments also recognize that shape-pairs at a different pitch, where the spacing between shapes is also greater than the minimum spacing constraint, exhibit good printability. The printability of a shape is considered good if the printed shape does exhibit small lithographic variation (less than a threshold lithographic variation) or acceptable electrical properties (less than a threshold variation in an electrical value) within the tolerances specified in the design specifications. Such a pitch is referred to as a "preferred pitch" in this disclosure.

The illustrative embodiments further recognize that the forbidden pitch or the preferred pitch may not be a unique pitch size but a range of pitches. In other words, one range of pitches may be forbidden pitches and another range of pitches may be preferred pitches. Furthermore, the illustrative embodiments recognize that a pitch characteristic is not the only characteristic that exhibits good or poor printability even with greater than minimum spacing constraint sizing. For example, a combination of width of a shape or spacing between shapes may also show good or poor printability even with greater than minimum spacing constraint sizing.

Accordingly, the illustrative embodiments recognize that even after a valid coloring solution is generated for a given layout, the MPL using that color solution can result in a printed shape that fails to satisfy a design specification.

The illustrative embodiments used to describe the invention generally address and solve the above-described problems and other problems related to pitch-aware coloring for DPL and MPL. The illustrative embodiments provide a method, system, and computer program product for pitch-aware MPL.

An embodiment provides additional factors to consider in creating a coloring solution in a layout decomposition. Particularly, an embodiment considers not only the minimum spacing constraint of the MPL technology, but also individual values or ranges of preferred and forbidden pitches in creating a coloring solution for a layout.

An embodiment not only colors smaller than the minimum spacing constraint shapes or features in the layout, but also increases the occurrences of shapes or features of preferred sizes and decreases the occurrences of shapes or features of forbidden sizes in each of the individual decomposed patterns. By increasing the occurrences of preferred-sized shapes or features, and by decreasing the occurrences of forbidden-sized shapes or features in each individual mask of the MPL, an embodiment improves the printability of the layout for MPL.

While the embodiments are described using forbidden and preferred values or ranges for a pitch characteristic of a layout, the pitch is not the only layout characteristic contemplated within the scope of the illustrative embodiments. An embodiment can be adapted to use any number or range of forbidden widths, forbidden spacing distances, forbidden pitches, preferred widths, preferred spacing distances, preferred pitches, other forbidden and preferred layout characteristics, or a combination thereof, within the scope of the illustrative embodiments. Any "pitch" related term described in this disclosure is an example of a generalized "distance" related term, and is similarly applicable to any distance measurement as commonly used in IC design methodologies.

While some embodiments are described with respect to DPL, an implementation may use an embodiment with respect to any number of patterns in MPL without departing the scope of the invention. For example, an implementation may create a coloring solution using three or four colors in the manner of an embodiment without departing the scope of the invention.

The illustrative embodiments are described with respect to certain ICs or circuits only as examples. Such descriptions are not intended to be limiting on the invention. For example, an illustrative embodiment can be implemented with respect to a microprocessor design or a design of a memory in a similar manner within the scope of the illustrative embodiments.

The illustrative embodiments are described with respect to certain data, data structures, file-systems, file names, directories, and paths only as examples. Such descriptions are not intended to be limiting on the invention. For example, an illustrative embodiment described with respect to a local application name and path can be implemented as an application on a remote path within the scope of the invention.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are described using specific code, designs, architectures, layouts, schematics, and tools only as examples and are not limiting on the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. An illustrative embodiment may be implemented in hardware, software, or a combination thereof.

The examples in this disclosure are used only for the clarity of the description and are not limiting on the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 2:
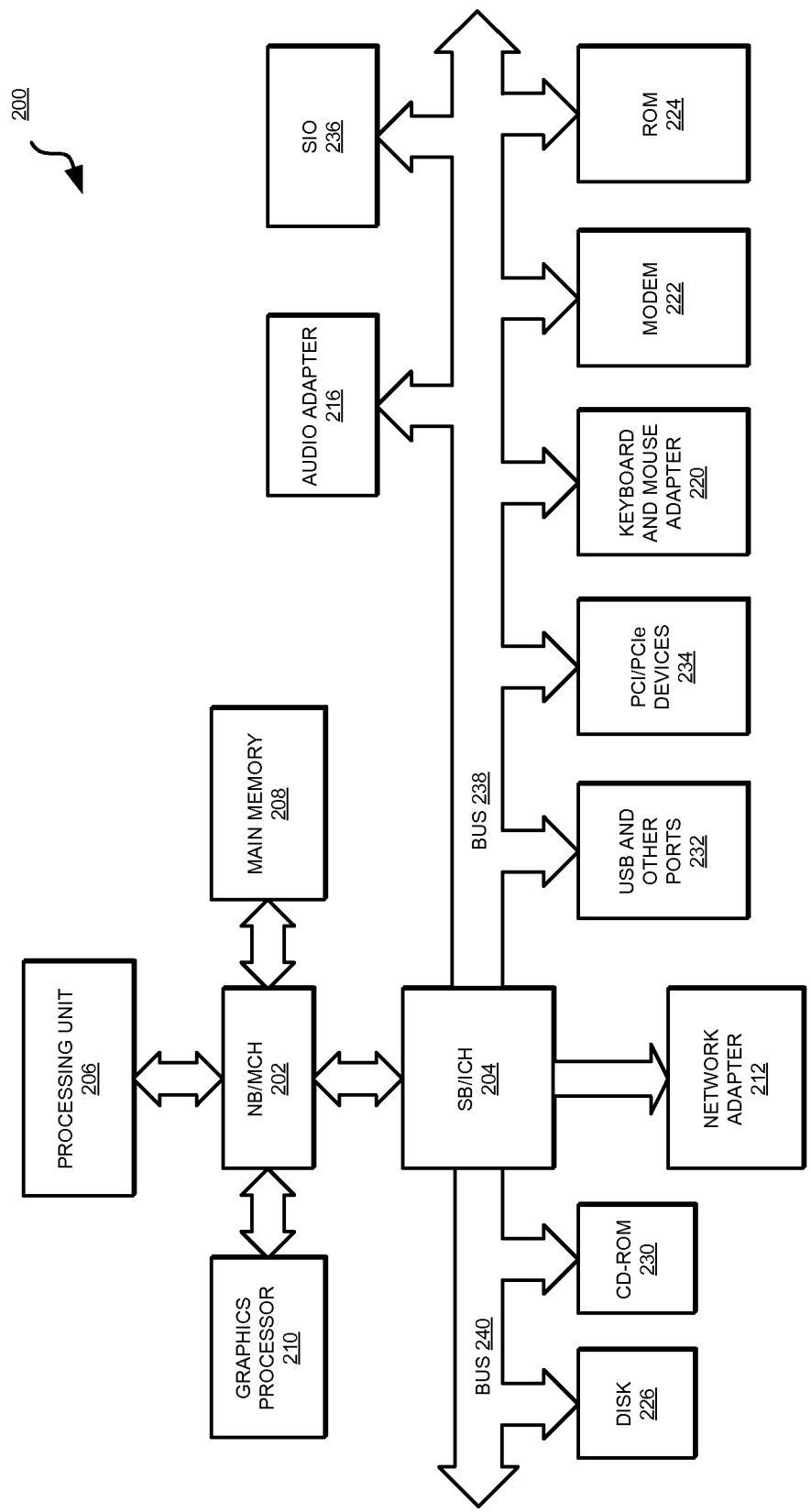
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

Only as an example, and without implying any limitation to such architecture, FIG. 1 depicts certain components that are typically used for creating a coloring solution for an IC design layout. For example, server 104, may include design tool 105 that may be improved using an embodiment. Design tool 105 may be any suitable software application for designing ICs. Application 107 may be any combination of hardware and software usable for implementing an embodiment of the invention such that the embodiment is usable with design tool 105 for dynamic pin access maximization.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, or another type of device in which computer usable program code or instructions implementing the processes may be located for the illustrative embodiments.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive 226, CD-ROM 230, and other similarly usable devices are some examples of computer usable storage devices including computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft° Windows® (Microsoft and Windows are trademarks of Microsoft Corporation in the United States and other countries), or Linux° (Linux is a trademark of Linus Torvalds in the United States and other countries). An object oriented programming system, such as the Java™ programming system, may run in conjunction with the operating system and provides calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 107 in FIG. 1, are located on storage devices, such as hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

Figure 3:
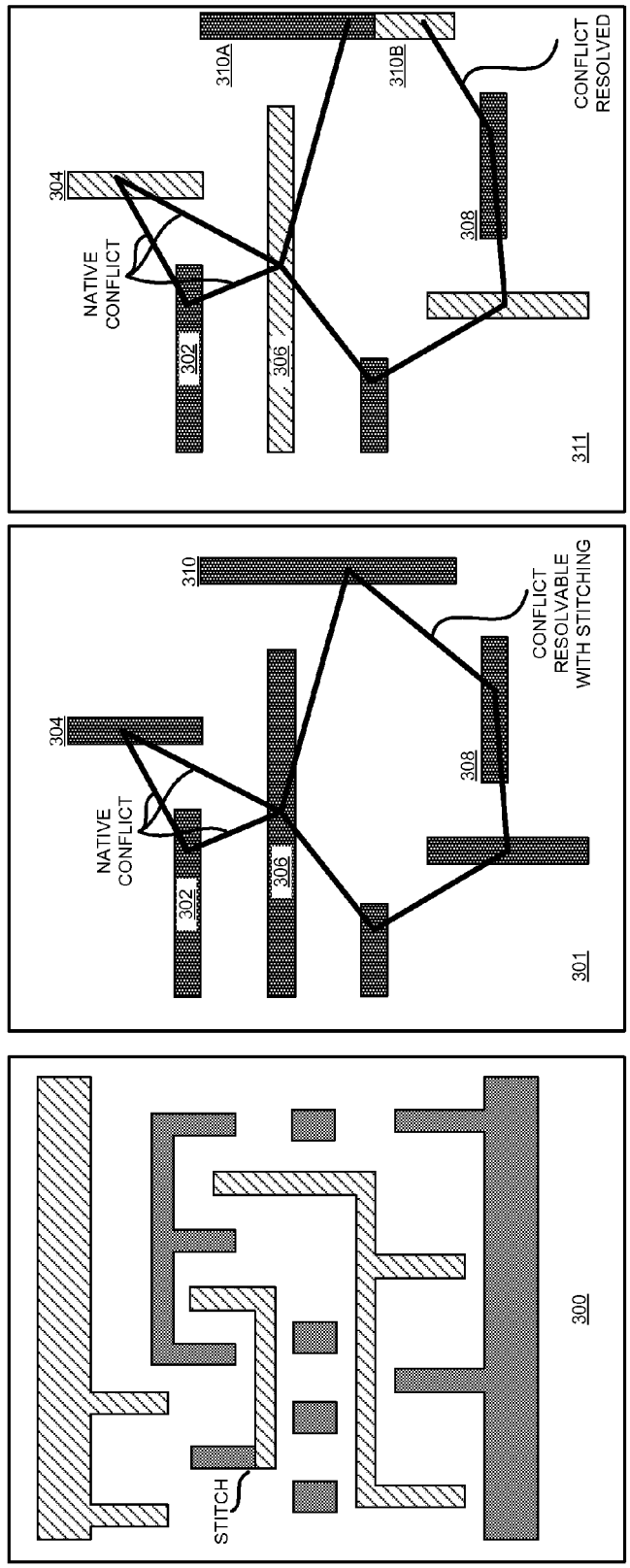
FIG. 3 depicts a block diagram of an example double-patterned cell including coloring conflicts, whose coloring solution can be improved using an illustrative embodiment.

With reference to FIG. 3, this figure depicts a block diagram of an example double-patterned cell including coloring conflicts, whose coloring solution can be improved using an illustrative embodiment.

Cell 300 is an example cell including several double patterned shapes. An example stitch is also depicted in cell 300. Portion 301 is a part of cell 300 and depicts certain types of conflicts that have to be resolved in cell 300 for DPL. For example shapes 302, 304, and 306 are so positioned in portion 301 that a native conflict exists amongst them. Shapes 306 and 308 have a minimum spacing conflict with shape 310.

Using prior art coloring solution methodologies, the conflict between shapes 308 and 310 can be resolved by using a stitch as depicted in portion 311. By stitching shape 310 using shapes 310A and 310B, a minimum spacing conflict is resolved between shape 308 and 310B and another minimum spacing conflict is resolved between shapes 306 and 310A. The native conflict between shapes 302, 304, and 306 remains because no two-color solution will resolve this native conflict. The native conflict has to be removed by a layout change or by using a three or more color solution.

Even after all the conflicts in portion 311 are resolved using prior art coloring solutions, portion 311 may exhibit poor printability due to certain pitch values, shape widths, spacing distances, or other characteristics that prior art coloring solutions for MPL do not address. Thus, a coloring solution with no conflicts can remain unusable due to such other factors.

Figure 4:
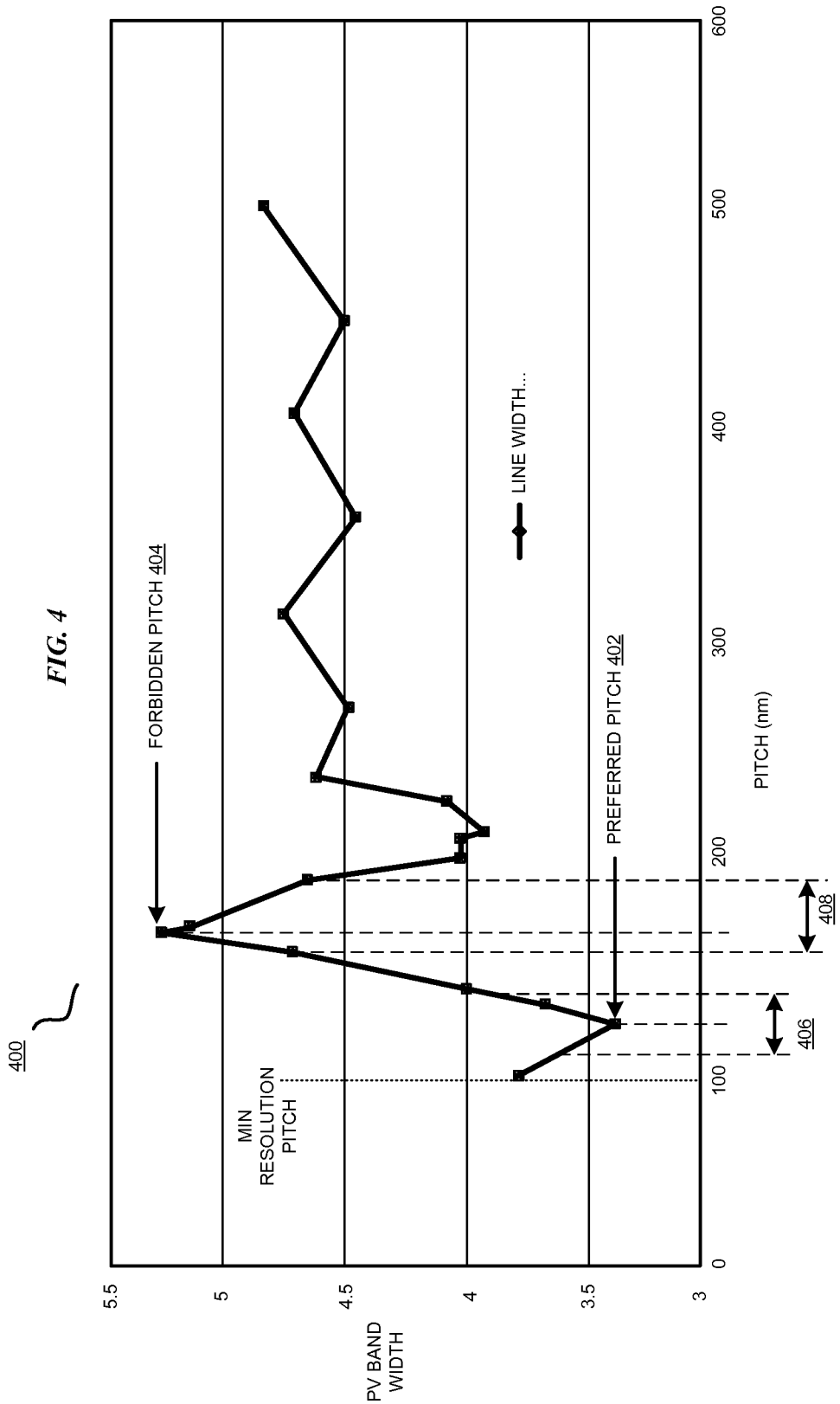
FIG. 4 depicts an example process variation graph that can be used in accordance with an illustrative embodiment.

With reference to FIG. 4, this figure depicts an example process variation graph that can be used in accordance with an illustrative embodiment. Pitch is used as an example layout characteristic for the clarity of the description and not as a limitation on the illustrative embodiments. Graph 400 depicts line-width variability versus pitch, observed through simulation, for an example wire in a layout, such as in portion 311 in FIG. 3.

Line-width variability is represented as process variability band width (PV band width), depicted on the Y-axis. PV band width represents the variability inherent in the lithography technology used to fabricate the example wire. PV band width is a measure of the difference between the widest and the smallest printed line-widths due to variation in the lithographic dose, focus, and other parameters. The higher the variability (higher PV band width), the harder the shape or wire is to print during lithography, i.e., the poorer the printability of the shape or the wire. A 30 nm wide wire in a layout printing as a 25 nm wide wire or a 35 nm wide wire during lithography is an example of poor printability. Conversely, the lower the variability (lower PV band width), the easier the shape or wire is to print during lithography, i.e., the better the printability of the shape or the wire. A 30 nm wide wire in a layout printing as a 30 nm wide wire or a 31 nm wide wire during lithography is an example of good printability.

In example graph 400, assume that the minimum resolution pitch in the given lithography technology is 100 nm. Thus, a valid coloring solution must have all pitch values of at least 100 nm or larger. However, as shown in graph 400, even in a valid coloring solution, the through pitch behavior of the line (wire) shows different PV band widths for different pitch values. The lowest PV band width is observed at pitch value of approximately 120 nm and the greatest PV band width is observed at pitch value of approximately 170 nm.

In one embodiment, the pitch value at which the lowest PV band width is observed is designated preferred pitch 402. The pitch value at which the highest PV band width is observed is designated forbidden pitch 404. In another embodiment, a range of pitch values around the pitch value at which the lowest PV band width is observed, such as range 406, is designated preferred pitch range. Similarly, a range of pitch values around the pitch value at which the highest PV band width is observed, such as range 408, is designated forbidden pitch range. In another embodiment, depending on the PV band response to pitch, more than one range of pitch values can be used for preferred and forbidden pitches.

For a given layout, an embodiment solves the conflicts and also adjusts the resultant pitch values in the decomposed patterns to maximize the occurrences of pitch values within a preferred pitch range, such as, for example, at preferred pitch 402, or within preferred pitch range 406. An embodiment further adjusts the resultant pitch values in the decomposed patterns to minimize the occurrences of pitch values within a forbidden pitch range, such as, for example, at forbidden pitch 404, or within forbidden pitch range 408. An embodiment further attempts to perform this maximization and minimization according to a cost criterion, as described in detail with respect to FIG. 5.

Figure 5:
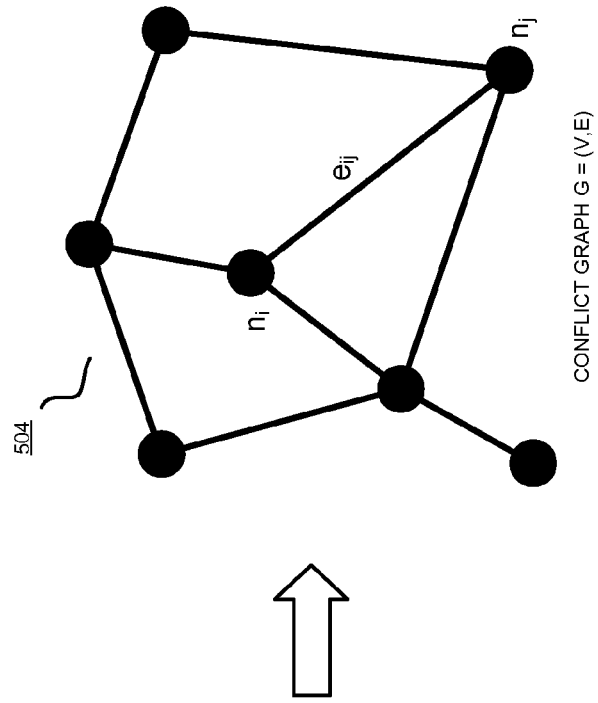
FIG. 5 depicts an example conflict graph for an example layout that can be used to resolve conflicts, maximize preferred pitches, and minimize forbidden pitches in accordance with an illustrative embodiment.
Figure 5:
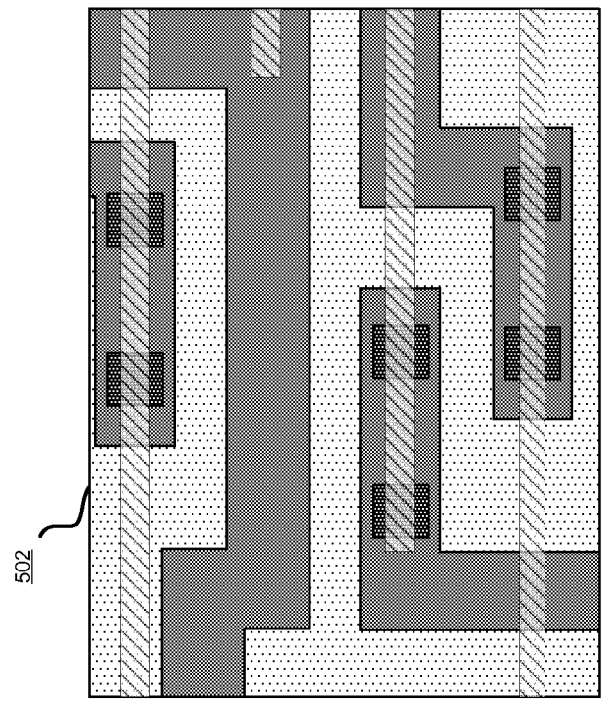

With reference to FIG. 5, this figure depicts an example conflict graph for an example layout that can be used to resolve conflicts, maximize preferred pitches, and minimize forbidden pitches in accordance with an illustrative embodiment. Layout 502 may be a layout used in the simulation to generate graph 400 in FIG. 4.

Assume, for example, that layout 502 is to be produced using double-patterning masks. In reducing layout 502 to DPL masks, assume that a set of shapes, including but not limited to wires, includes shapes that have some conflict with another shape in the set.

Conflict graph 504 depicts each member of the set of shapes with conflicts as a node. For example, node $n_i$ corresponds to shape i, and node $n_j$ corresponds to shape j. edge $e_{ij}$ represents a conflict between nodes $n_i$ and $n_j$. conflict graph 504 is a collection or set of such nodes and edges, and is represented as graph G=(V,E), where V represents the nodes and E represents the edges.

When formulating a coloring problem for conflict resolution, conflicting shapes or features are assigned different colors. Solving a conflict, only for decomposing the layout into conflict-free different color patterns, as in the prior art, only requires that the spacing be at least a minimum size. Any shape-pairs that have a spacing greater than the minimum spacing size can then be colored using the same or different colors.

An embodiment solves conflict graph 504 to remove the conflicts, maximize preferred pitches (or another preferred one or more characteristics), and minimize forbidden pitches (or another forbidden one or more characteristics) in the decomposed patterns. Using preferred pitch and forbidden pitch as an example layout characteristic in an Integer Linear Programming (ILP) algorithm, and without implying any limitation either the pitch characteristic or the algorithm, suppose—

$x_i$ and $x_j$ are binary (0/1) variables for the colors assigned to nodes $n_i$ and $n_j$. For example, $x_i$ takes value 0 for a first color, and value 1 for a second color; $x_j$ takes value 0 or 1 in a similar manner.

$\lambda_{ij}$ are also binary (0/1) variables, which should assume value 1 when $n_i$ and $n_j$ are colored differently and 0 otherwise.

$ST_{ij}$, $PP_{ij}$ and $FP_{ij}$ are pre-determined stitch, preferred pitch and forbidden pitch related costs for each pair of shapes.

$ST_{ij}$ is the stitch cost of coloring touching shapes differently if $n_i$ and $n_j$ share a common stitch, and 0 otherwise.

$PP_{ij}$ is the cost incurred by different coloring of shapes corresponding to $n_i$ and $n_j$ if $n_i$ and $n_j$ are preferred pitch apart, and 0 otherwise.

$FP_{ij}$ is the cost associated with same coloring of shapes corresponding to $n_i$ and $n_j$ if $n_i$ and $n_j$ are forbidden pitch apart, and 0 otherwise.

An embodiment solves conflict graph according to the following pitch-aware coloring formulation—
Minimize $$\Sigma[\lambda_{ij}(ST_{ij}+PP_{ij})+(1-\lambda_{ij})FP_{ij}]$$

Subject to
$x_i+x_j=1$, which means that xi and xj cannot be of the same color;
$\forall e_{ij} \in E$;
$x_i-x_j \le \lambda_{ij}$; and
$x_j-x_i \le \lambda_{ij}$ The example pitch-aware coloring formulation of an embodiment includes a cost function that penalizes same coloring of forbidden pitches and different coloring of preferred pitches. The cost function also includes the cost of stitching two shapes when $n_i$ and $n_j$ share a common stitch.

In other words, the cost of a stitch between $n_i$ and $n_j$ is zero when $n_i$ and $n_j$ are the same color, and some positive cost when they are not the same color). $PP_{ij}$ will be zero when $n_i$ and $n_j$ are not preferred pitch apart, and take on some value when they are preferred pitch apart. $FP_{ij}$ will be zero when $n_i$ and $n_j$ are not forbidden pitch apart, and take on some value when they are forbidden pitch apart.

In the pitch-aware coloring formulation, $\lambda_{ij}$ takes the value 1 when $n_i$ and $n_j$ are colored differently. $\lambda_{ij}$ multiplies with any stitch cost between $n_i$ and $n_j$ and a preferred pitch cost if $n_i$ and $n_j$ are preferred pitch apart. $(1-\lambda_{ij})$ is 1 when $n_i$ and $n_j$ are colored the same. $(1-\lambda_{ij})$ multiplies with a forbidden pitch cost if $n_i$ and $n_j$ are forbidden pitch apart. The pitch-aware coloring formulation tries to minimize this function of costs to achieve improved printability of the design.

In other words, the formulation of an embodiment satisfies the lithographic constraints, such as a minimum spacing constraint or a minimum pitch distance, and also satisfies a design objective to minimize a function of stitch costs, preferred pitch costs, and forbidden pitch costs. Satisfying lithographic constraints makes the layout printable using MPL, but with some features with poor printability. Satisfying the objectives through the minimization function imparts improved printability to the layout in MPL.

Figure 6:
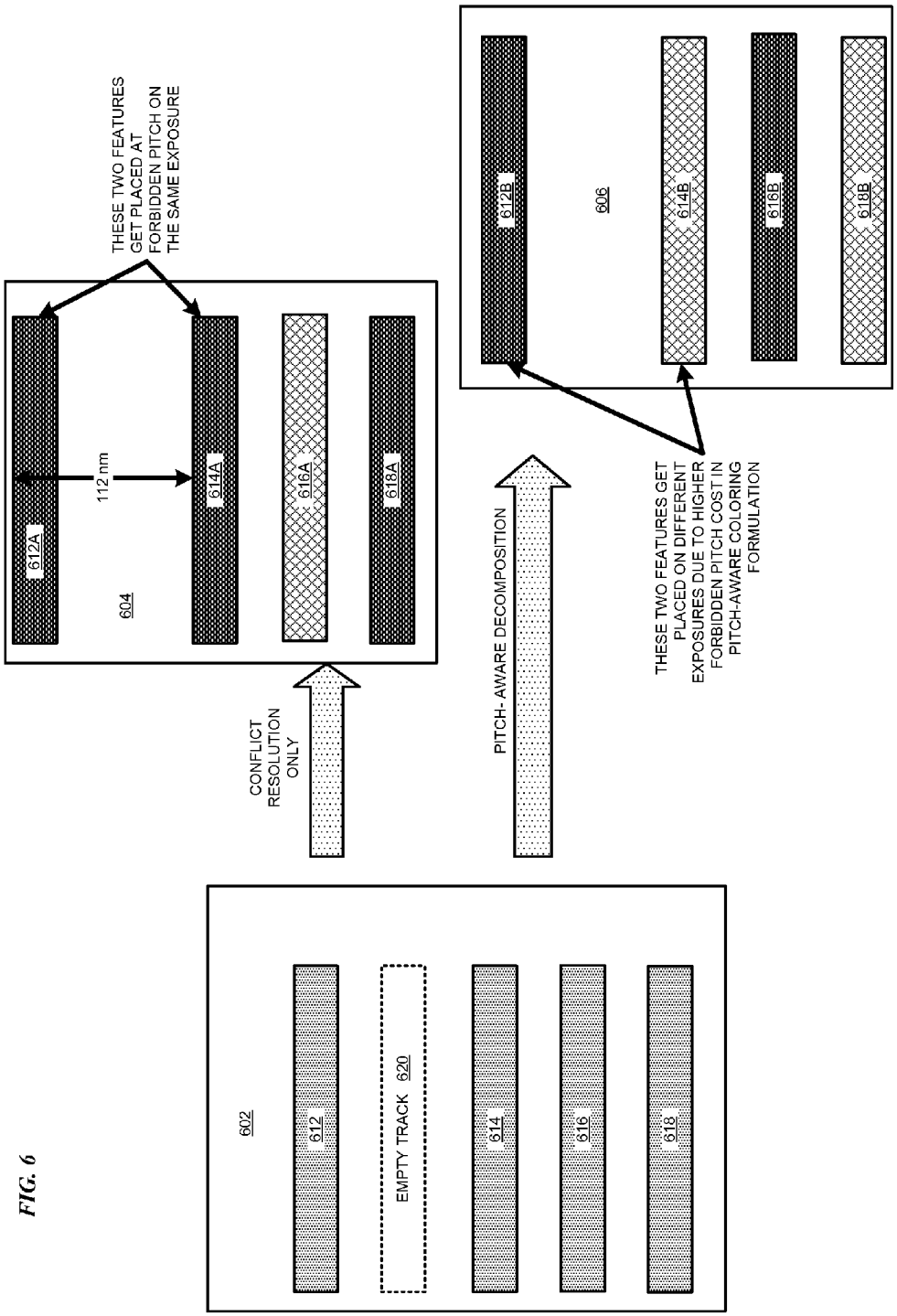
FIG. 6 depicts a block diagram of two coloring solutions to demonstrate the improved printability of a multi-patterning layout achieved by using an illustrative embodiment.

With reference to FIG. 6, this figure depicts a block diagram of two coloring solutions to demonstrate the improved printability of a multi-patterning layout achieved by using an illustrative embodiment. Layout 602 may be used as layout 502 in FIG. 5.

In a simplified form, layout 602 is depicted to include shapes 612, 614, 616, and 618, and empty track 620. Assume, only for example and not as a limitation, that layout 602 has to be colored for DPL using two colors. Coloring solution 604 results when layout 602 is decomposed for color patterning according to prior art formulation for conflict resolution only. Coloring solution 606 results when layout 602 is subjected to pitch-aware decomposition, for not only conflicts resolution but also to minimize a function of stitch costs, preferred pitch costs, and forbidden pitch costs, in the manner described with respect to FIG. 5.

Note that because of empty track 620 between shapes 612 and 614, shapes 612 and 614 are more than a minimum pitch apart. Accordingly, a prior art coloring solution colors corresponding shapes 612A and 614A the same in coloring solution 604. Shapes 614 and 616 are not more than a minimum pitch apart. Accordingly, a prior art coloring solution colors corresponding shapes 614A and 616A using different colors in coloring solution 604. Shapes 616 and 618 are not more than a minimum pitch apart. Accordingly, a prior art coloring solution colors corresponding shapes 616A and 618A using different colors in coloring solution 604.

However, note that shapes 612 and 614 are at a forbidden pitch in layout 602. Accordingly, a prior art coloring solution that generates solution 604 colors corresponding shapes 612A and 614A the same at a forbidden pitch. If layout 602 were printed using coloring solution 604, coloring solution 604 will exhibit poor printability, with corresponding shapes 612A, 614A, or a combination thereof, exhibiting electrical properties outside the tolerance bounds of the design specification.

An embodiment, on the other hand, accounts for the forbidden pitch between shapes 612 and 614 in finding a pitch-aware coloring solution. Accordingly, a pitch-aware decomposition of layout 602 results in coloring solution 606, which assigns different colors to corresponding shapes 612B and 614B. Colors of shapes 616B and 618B, which correspond to shapes 616 and 618 in layout 602, also change due to the change of color of shape 614B.

Accordingly, shapes 612B and 614B are placed on different masks to print the design. The printability of shapes 612B and 614B is improved in that the resulting shapes in the printed design exhibiting electrical properties within the tolerance bounds of the design specification.

Figure 7:
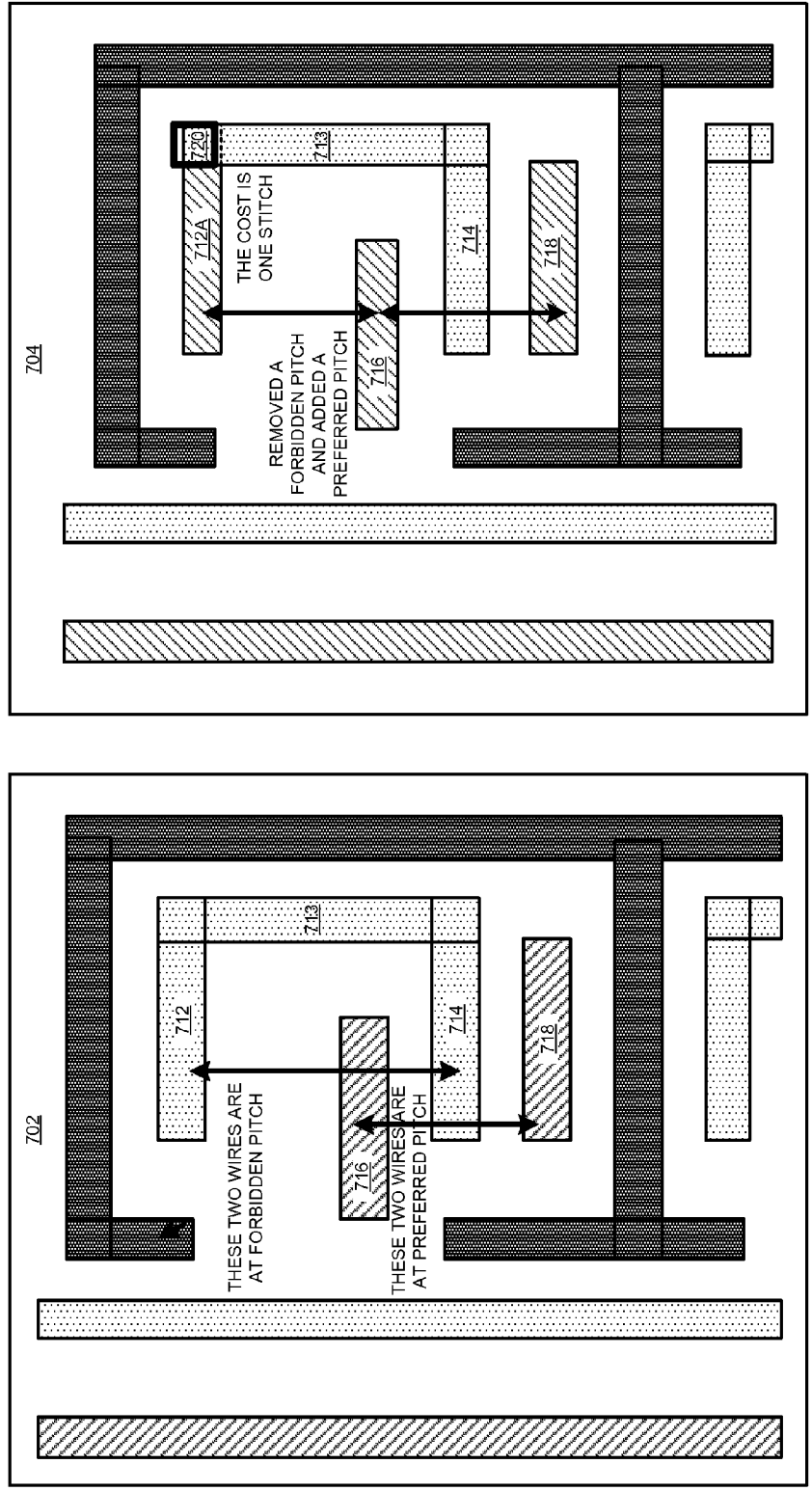
FIG. 7 depicts an example layout to demonstrate the improved printability of a multi-patterning layout achieved by using an illustrative embodiment.

With reference to FIG. 7, this figure depicts an example layout to demonstrate the improved printability of a multi-patterning layout achieved by using an illustrative embodiment. Coloring solution 702 is similar to coloring solution 604 in FIG. 6, produced using a prior art decomposition for conflicts resolution only. Coloring solution 704 is similar to coloring solution 606 in FIG. 6, produced using a pitch-aware decomposition according to an embodiment.

As shown in solution 702, shapes 712 and 714 are more than a minimum pitch apart at a forbidden pitch, and shapes 716 and 718 are more than a minimum pitch apart at a preferred pitch. Shapes 714 and 716 are less than a minimum pitch apart. According to a prior art decomposition, solution 702 colors shapes 712 and 714 with one color, shapes 716 and 718 a different color. Solution 702 will therefore result in poor printability for the reasons described above.

Solution 704 is generated using a pitch-aware decomposition according to an embodiment. As shown in solution 704, shapes 712A and 714 are colored differently because of their forbidden pitch. Furthermore, shapes 712A and 716 are another preferred pitch apart shapes that are now colored with the same color. Therefore, while coloring shape 712A different from shape 714 and the same as shape 716 adds the cost of stitch 720, but this coloring also removes a forbidden pitch favor of a preferred pitch from coloring solution 704, which improves printability.

Solution 704 might be acceptable if the cost of stitch 720 is less than the cost benefit of replacing a forbidden pitch with a preferred pitch. For example, if the cost of stitch 720 were sixty percent of the cost benefit of replacing a forbidden pitch with a preferred pitch, an embodiment would produce solution 704 for printing. On the other hand, if two such stitches were required, then the cost of the stitches would exceed the cost benefit of replacing a forbidden pitch with a preferred pitch, and an embodiment would continue modifying solution 704 to produce another solution for improving the printability.

Figure 8:
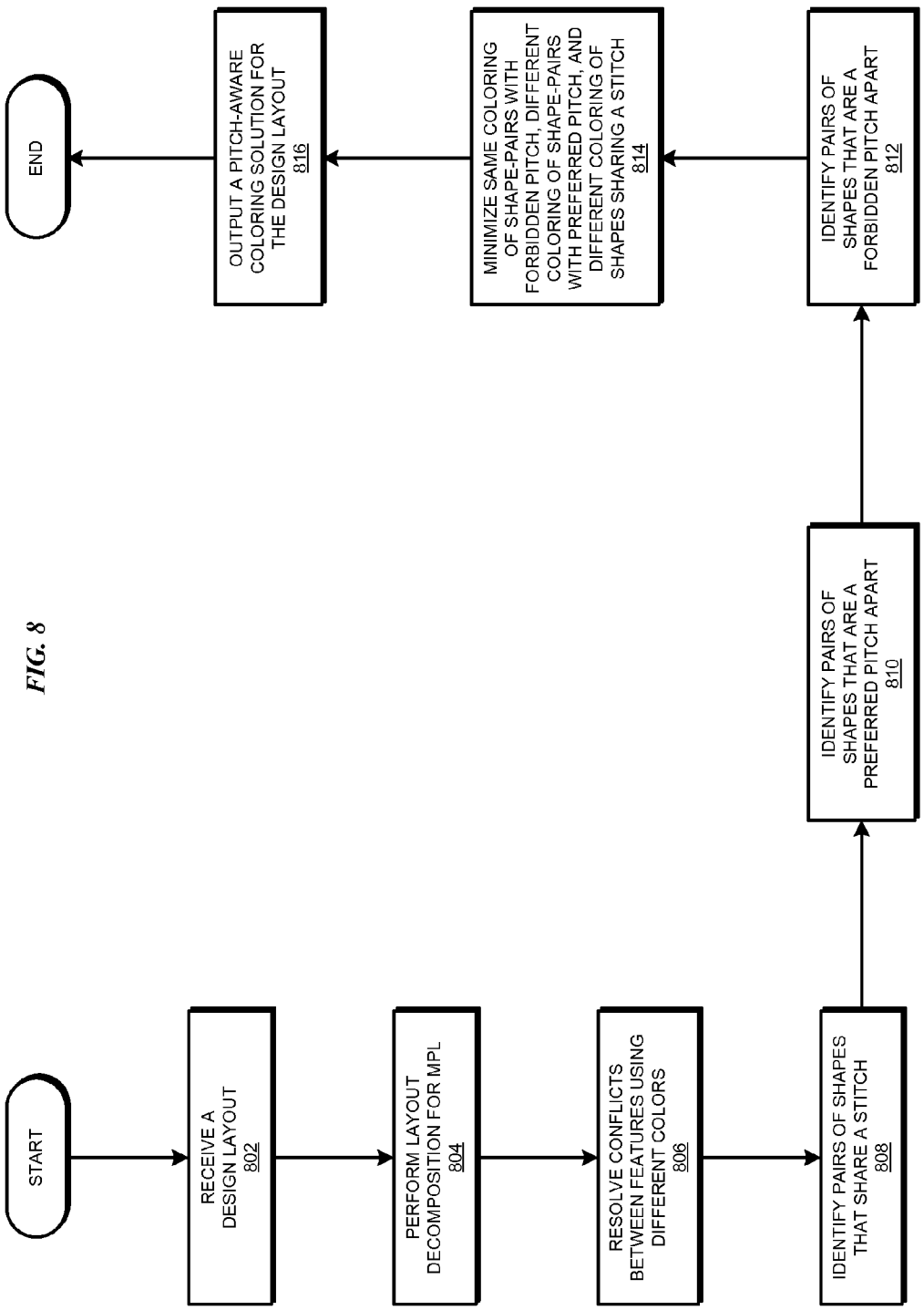
FIG. 8 depicts a flowchart of an example process for pitch-aware multi-patterning lithography in accordance with an illustrative embodiment.

With reference to FIG. 8, this figure depicts a flowchart of an example process for pitch-aware multi-patterning lithography in accordance with an illustrative embodiment. Process 800 can be implemented in application 107 in FIG. 1.

Process 800 begins by receiving a design layout (step 802). Process 800 performs a layout decomposition for MPL (step 804). Process 800 resolves conflicts between feature-pairs using different colors for the features in a conflicting feature pair (step 806).

Process 800 identifies pairs of shapes that share a stitch (step 808). Process 800 identifies pairs of shapes that are a preferred pitch apart (step 810). Process 800 identifies pairs of shapes that are a forbidden pitch apart (step 812).

Because preferred pitches and forbidden pitches are both greater than the minimum pitch requirement of the lithography technology being used, in the prior art, shapes that are a preferred pitch or a forbidden pitch apart can be colored using the same or different colors. Process 800 minimizes same coloring of shape-pairs with forbidden pitches, minimizes different coloring of shape-pairs with preferred pitches, and minimizes different coloring of shapes that share a stitch (step 814). Process 800 outputs a pitch-aware coloring solution for the design layout received in step 802 (step 816). Process 800 ends thereafter.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, a computer implemented method, system, and computer program product are provided in the illustrative embodiments for pitch-aware MPL. Using an embodiment, conflicts between shapes in a layout can be resolved to not only comply with minimum distance requirements of the relevant lithography technology, but also improve the printability of the design by enhancing the use of certain preferred measurements and diminishing the use of certain other forbidden measurement.

The embodiments are described using examples of a preferred pitch as the preferred measurement and examples of a forbidden pitch as the forbidden measurement. Such examples are not intended to be limiting on the illustrative embodiments. An embodiment is adaptable to other measurements in an IC design, such as a width or a spacing. Certain embodiments are described using examples of a wire shape. Such examples are not intended to be limiting on the illustrative embodiments. An embodiment is adaptable to any other shape in an IC design without limitation.

In one embodiment, if a forbidden measurement must be avoided, such as when a cost of forbidden measurement is greater than a threshold, the forbidden measurement, such as a forbidden pitch between shapes, can be added to a conflict graph as a conflicting edge. An embodiment would then place the conflicting shape-pairs into different color masks, thus removing the forbidden measurement from a single color mask.

ILP formulation is described in this disclosure only as an example and not as a limitation on the illustrative embodiments. Any suitable decomposition heuristic or algorithm can be used in the manner of an embodiment within the scope of the illustrative embodiments.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable signal medium or a computer readable storage medium. A computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible device or medium that can contain, or store a program for use by or in connection with an instruction execution system, apparatus, or device.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable media that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or more computers, one or more other programmable data processing apparatuses, or one or more other devices to cause a series of operational steps to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A computer implemented method for improving printability of a design of an integrated circuit (IC) using pitch-aware coloring for multi-patterning lithography (MPL), the method comprising:

identifying, in a layout of the IC corresponding to the design, a first shape in a first pair of shapes and a second shape in the first pair of shapes that are apart by a first distance, the first distance being at least equal to a minimum distance requirement of a lithography system, the first distance forming a forbidden distance;

determining that the first shape in the first pair of shapes and the second shape in the first pair of shapes are colored using a first color;

changing, using a processor and a memory, the first shape in the first pair of shapes to a second color, such that even though the first distance is at least equal to the minimum distance requirement of the lithography system, the first shape in the first pair of shapes and the second shape in the first pair of shapes are placed on different masks to print the design, thereby improving the printability of the design.

2. The computer implemented method of claim 1, further comprising:

identifying, in the layout, a third shape in a second pair of shapes and a fourth shape in the second pair of shapes are apart by a second distance, the second distance being at least equal to a minimum distance requirement of a lithography system, the second distance forming a preferred distance;

determining that the third shape in the second pair of shapes is colored using the first color and the fourth shape in the second pair of shapes is colored using the second color;

changing the fourth shape in the second pair of shapes to the first color, such that the third shape in the second pair of shapes and the fourth shape in the second pair of shapes are placed on a common mask to print the design.

3. The computer implemented method of claim 2, wherein the forbidden distance is a forbidden pitch, and the preferred distance is a preferred pitch.

4. The computer implemented method of claim 2, wherein the forbidden distance is within a range of forbidden distances, and wherein the preferred distance is within a range of preferred distances.

5. The computer implemented method of claim 2, further comprising:

identifying, in the layout, that a fifth shape in a third pair of shapes and a sixth shape in the third pair of shapes share a stitch;

determining that the fifth shape in the third pair of shapes is colored using the first color and the sixth shape in the third pair of shapes is colored using the second color;

changing the sixth shape in the third pair of shapes to the first color, such that the fifth shape in the third pair of shapes and the sixth shape in the third pair of shapes are placed on a common mask to print the design, and wherein changing the sixth shape to the first color causes a forbidden distance in the layout to be replaced with a preferred distance.

6. The computer implemented method of claim 5, wherein the changing is responsive to an algorithm minimizing a cost function that (i) penalizes same coloring of shapes separated by the forbidden distance, (ii) penalizes different coloring of shapes separated by the preferred distance, and (iii) considers a cost of stitching two shapes when the two shapes share a common stitch.

7. The computer implemented method of claim 6, wherein, for the layout, the minimizing minimizes $\Sigma[\lambda_{ij}(ST_{ij}+PP_{ij})+(1-\lambda_{ij})FP_{ij}]$
subject to $x_i+x_j=1, \forall e_{ij} \in E, x_i-x_j \leq \lambda_{ij}, \text{ and } x_j-x_i \leq \lambda_{ij};$ and wherein $x_i$ and $x_j$ are binary variables taking a value 0 for the first color, and a value 1 for the second color assigned to shapes $n_i$ and $n_j$, $\lambda_{ij}$ are binary variables, which take the value 1 when $n_i$ and $n_j$ are colored differently and the value 0 when $n_i$ and $n_j$ are colored the same, $ST_{ij}$ is a cost of a stitch by coloring touching shapes differently if $n_i$ and $n_j$ share a common stitch, $PP_{ij}$ is a cost of coloring shapes $n_i$ and $n_j$ differently if shapes $n_i$ and $n_j$ are apart by the preferred distance, and $FP_{ij}$ is a cost of coloring shapes $n_i$ and the same if shapes $n_j$ and are apart by the forbidden distance.

8. The computer implemented method of claim 6, wherein the algorithm is an Integer Linear Programming (ILP) algorithm.

9. The computer implemented method of claim 1, further comprising:

receiving the layout; and presenting a pitch-aware coloring solution for the layout, the pitch-aware coloring solution including the different masks.

10. The computer implemented method of claim 1, further comprising:

performing a layout decomposition for MPL by detecting that a third pair of shapes in the layout are apart by less than the minimum distance requirement of the lithography system; and complying with the minimum distance requirement of a lithography system by coloring a first shape in the third pair of shapes using the first color and a second shape in the third pair of shapes using the second color.

11. A computer usable program product comprising a computer usable storage device including computer usable code for improving printability of a design of an integrated circuit (IC) using pitch-aware coloring for multi-patterning lithography (MPL), the computer usable code comprising:

computer usable code for identifying, in a layout of the IC corresponding to the design, a first shape in a first pair of shapes and a second shape in the first pair of shapes that are apart by a first distance, the first distance being at least equal to a minimum distance requirement of a lithography system, the first distance forming a forbidden distance;

computer usable code for determining that the first shape in the first pair of shapes and the second shape in the first pair of shapes are colored using a first color;

computer usable code for changing the first shape in the first pair of shapes to a second color, such that even though the first distance is at least equal to the minimum distance requirement of the lithography system, the first shape in the first pair of shapes and the second shape in the first pair of shapes are placed on different masks to print the design, thereby improving the printability of the design.

12. The computer usable program product of claim 11, further comprising:

computer usable code for identifying, in the layout, a third shape in a second pair of shapes and a fourth shape in the second pair of shapes are apart by a second distance, the second distance being at least equal to a minimum distance requirement of a lithography system, the second distance forming a preferred distance;

computer usable code for determining that the third shape in the second pair of shapes is colored using the first color and the fourth shape in the second pair of shapes is colored using the second color;

computer usable code for changing the fourth shape in the second pair of shapes to the first color, such that the third shape in the second pair of shapes and the fourth shape in the second pair of shapes are placed on a common mask to print the design.

13. The computer usable program product of claim 12, wherein the forbidden distance is a forbidden pitch, and the preferred distance is a preferred pitch.

14. The computer usable program product of claim 12, wherein the forbidden distance is within a range of forbidden distances, and wherein the preferred distance is within a range of preferred distances.

15. The computer usable program product of claim 12, further comprising:

computer usable code for identifying, in the layout, that a fifth shape in a third pair of shapes and a sixth shape in the third pair of shapes share a stitch;

computer usable code for determining that the fifth shape in the third pair of shapes is colored using the first color and the sixth shape in the third pair of shapes is colored using the second color;

computer usable code for changing the sixth shape in the third pair of shapes to the first color, such that the fifth shape in the third pair of shapes and the sixth shape in the third pair of shapes are placed on a common mask to print the design, and wherein changing the sixth shape to the first color causes a forbidden distance in the layout to be replaced with a preferred distance.

16. The computer usable program product of claim 15, wherein the computer usable code for changing is responsive to an algorithm minimizing a cost function that (i) penalizes same coloring of shapes separated by the forbidden distance, (ii) penalizes different coloring of shapes separated by the preferred distance, and (iii) considers a cost of stitching two shapes when the two shapes share a common stitch.

17. The computer usable program product of claim 16, wherein, for the layout, the computer usable code for minimizing minimizes $\sigma[\lambda_{ij}(ST_{ij}+PP_{ij})+(1-\lambda_{ij})FP_{ij}]$
subject to $x_i + x_j = 1, \forall e_{ij} \in E, x_i - x_j \leq \lambda_{ij}, \text{ and } x_j - x_i \leq \lambda_{ij};$ and wherein $x_i$ and $x_j$ are binary variables taking a value 0 for the first color, and a value 1 for the second color assigned to shapes $n_i$ and $n_j$, $\lambda_{ij}$ are binary variables, which take the value 1 when $n_i$ and $n_j$ are colored differently and the value 0 when $n_i$ and $n_j$ are colored the same, $ST_{ij}$ is a cost of a stitch by coloring touching shapes differently if $n_i$ and $n_j$ share a common stitch, $PP_{ij}$ is a cost of coloring shapes $n_i$ and $n_j$ differently if shapes $n_i$ and $n_j$ are apart by the preferred distance, and $FP_{ij}$ is a cost of coloring shapes $n_i$ and the same if shapes $n_j$ and are apart by the forbidden distance.

18. The computer usable program product of claim 11, wherein the computer usable code is stored in a computer readable storage medium in a data processing system, and wherein the computer usable code is transferred over a network from a remote data processing system.

19. The computer usable program product of claim 11, wherein the computer usable code is stored in a computer readable storage medium in a server data processing system, and wherein the computer usable code is downloaded over a network to a remote data processing system for use in a computer readable storage medium associated with the remote data processing system.

20. A data processing system for improving printability of a design of an integrated circuit (IC) using pitch-aware coloring for multi-patterning lithography (MPL), the data processing system comprising:

a storage device including a storage medium, wherein the storage device stores computer usable program code; and a processor, wherein the processor executes the computer usable program code, and wherein the computer usable program code comprises:

computer usable code for identifying, in a layout of the IC corresponding to the design, a first shape in a first pair of shapes and a second shape in the first pair of shapes that are apart by a first distance, the first distance being at least equal to a minimum distance requirement of a lithography system, the first distance forming a forbidden distance;

computer usable code for determining that the first shape in the first pair of shapes and the second shape in the first pair of shapes are colored using a first color;

computer usable code for changing the first shape in the first pair of shapes to a second color, such that even though the first distance is at least equal to the minimum distance requirement of the lithography system, the first shape in the first pair of shapes and the second shape in the first pair of shapes are placed on different masks to print the design, thereby improving the printability of the design.

* * * * *